US007000176B2

(12) United States Patent
Dubey et al.

(10) Patent No.: US 7,000,176 B2
(45) Date of Patent: Feb. 14, 2006

(54) SCALABLE MODULAR ARCHITECTURE FOR PARITY CALCULATION

(75) Inventors: Ajay K. Dubey, Santa Clara, CA (US); Herve Bleunven, Oakland, CA (US)

(73) Assignee: Intel Corporation, Santa Clara, CA (US)

( * ) Notice: Subject to any disclaimer, the term of this patent is extended or adjusted under 35 U.S.C. 154(b) by 478 days.

(21) Appl. No.: 10/246,378

(22) Filed: Sep. 17, 2002

(65) Prior Publication Data

US 2004/0054961 A1     Mar. 18, 2004

(51) Int. Cl.
*G06F 11/00*     (2006.01)
*H03M 13/00*     (2006.01)

(52) U.S. Cl. ........................ 714/800; 714/776
(58) Field of Classification Search ................ 714/746, 714/704, 712, 799, 800–802, 776, 752; 370/901–907, 370/242, 476, 351, 465, 466
See application file for complete search history.

(56) References Cited

U.S. PATENT DOCUMENTS

| | | | | |
|---|---|---|---|---|
| 5,257,261 A | * | 10/1993 | Parruck et al. | 370/522 |
| 6,493,847 B1 | * | 12/2002 | Sorgi et al. | 714/800 |
| 6,859,453 B1 | * | 2/2005 | Pick et al. | 370/358 |

OTHER PUBLICATIONS

International Telecommunication Union, Series G: Transmission Systems and Media, Digital Systems and Networks, "Network node interface for the Synchronous Digital Hierarchy (SDH)," G.707, Oct. 2000, pp. i-164.

* cited by examiner

*Primary Examiner*—Shelly Chase
(74) *Attorney, Agent, or Firm*—Fish & Richardson P.C.

(57) ABSTRACT

A path parity error signal may be calculated by determining an inputted payload signal, determining a memory state, determining a previous path parity signal, determining a previous master signal, and relating them.

24 Claims, 9 Drawing Sheets

STS-N SYSTEM

SCALABLE MODULAR ARCHITECTURE FOR PARITY CALCULATION

TECHNICAL FIELD

This invention relates to optical communications, and more particularly to calculating parity errors.

BACKGROUND

SONET ("Synchronous Optical Network") is a widely used fiber-optics protocol that enables interoperable communications between optical communications gear of different vendors. As part of the protocol, parameters may be included in a transmission to describe different aspects of the transmission. For example, a parity error may be used to verify the integrity of the data received. One type of parity error is a path parity error, such as a Bit Interleaved Parity error (B3c) that detects whether a STS frame has experienced transmission errors across a path or envelope such that one or more bits of the frame are erroneous.

DESCRIPTION OF DRAWINGS

Like reference symbols in the various drawings indicate like elements.

DETAILED DESCRIPTION

Figure 1:
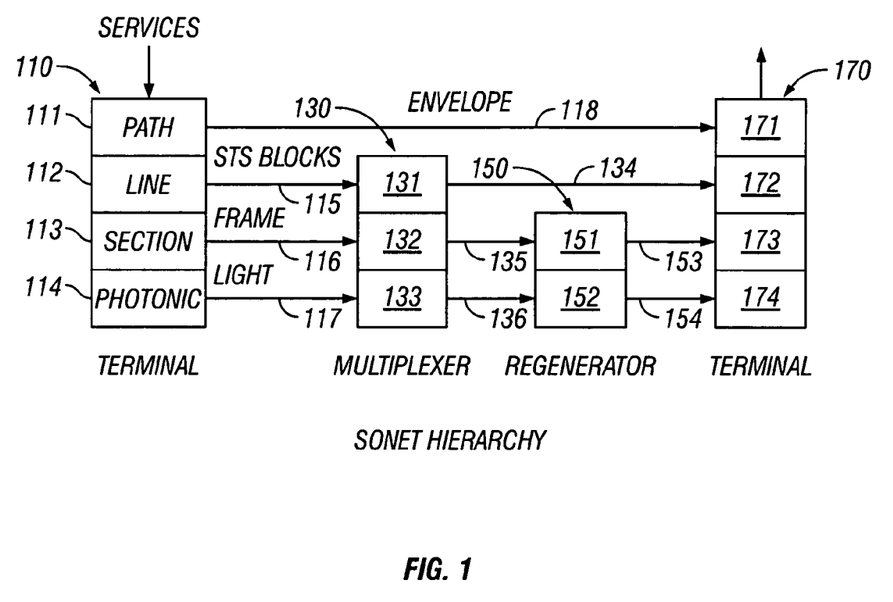
FIG. 1 is a block diagram illustrating how different levels of the SONET protocol stack function.

As shown in FIG. 1, a SONET system 100 enables optical communications between a terminal 110 and a terminal 170 through a multiplexer 130 and a regenerator 150. The SONET system 100 includes a protocol stack made up of four layers that are depicted in terminals 110 and 170. As shown with respect to terminal 110, the SONET layers include a path layer 111, a line layer 112, a section layer 113, and a photonic layer 114. Similarly, the terminal 170 also supports a path layer 171, a line layer 172, a section layer 173, and a photonic layer 174.

Path layer 111 includes parameters that are structured and arranged to manage the end-to-end transmission between two terminals. As such, path layer 111 transmits an envelope 118 to path layer 171 of terminal 170 to exchange information.

The line layer 112 of the protocol stack is responsible for connecting several section layers. In general, the line layer 112 is responsible for combining lower rate signals into a higher rate signal in the form of STS blocks 115, such as an STS-1.

The section layer 113 is responsible for maintaining signal strength. Aspects of the section layer 113 include the loss rate of the optical signal. In general, information at the section layer 113 is used to create a frame 116. A SONET frame is a logical unit that arranges individually received bits into a larger message, in this case a frame. The frame 116 is transmitted between terminal 110 and multiplexer 130.

The photonic layer 114 is responsible for the optical characteristics of the light 117 transmitted over an optical fiber. In general, the photonic layer 114 includes link characteristics between generation of a photon from an electrical signal and conversion of the photon back into an electrical signal. In terminal 110, the photonic layer 114 includes the wavelength and other waveform characterstics of the light.

In general, the multiplexer 130 is a device structured and arranged to combine several received STS frames onto a line when transmitting, and to de-multiplex concatenated data when receiving. For example, a carrier may aggregate several lower rate circuits onto a higher speed circuit (e.g., aggregate several STS-3s frames onto a single STS-12 frame). The multiplexer 130 may receive data from different sources and consolidates the data onto one outbound fiber to a destination at which the data may either be demultiplexed and/or terminated (e.g., by the terminal 170 or another multiplexer that is not shown).

Because the multiplexer 130 may aggregate data, the lower layers of the protocol are terminated and reconstructed between multiplexers. For example, the multiplexer 130 terminates the STS-1 115 of the line layer 112, the frames 116 of the section layer 113 and the light 117 of the photonic layer 114 from the terminal 110. As the signal is transmitted from the multiplexer 130, an STS-1 134, a frame 135, and light 136 are generated as part of that transmission.

The regenerator 150 is structured and arranged to ensure that the optical signal retains strength sufficient for reception. Because the regenerator 150 is structured and arranged to keep the signal "alive" for reception until the next device, the regenerator 150 does not modify the parameters of the envelope 118 or the STS-1 134. Instead, the regenerator ISO terminates the fame 135 and the light 136, regenerates a frame 153 and light 154, and transmits those results to terminal 170.

The terminal 170 receives the optical signal from regenerator 150. Path layer 171 terminates envelope 118, section layer 172 terminates STS-1 134, a line layer 173 that terminates frame 153, and a photonic layer 174 that terminates the light 154. At each termination, parameters in the corresponding layer of the protocol may be checked for transmission errors. For example, across envelope 118, a path is examined for path parity (also known as BIP-8 B3) errors.

Figure 2:
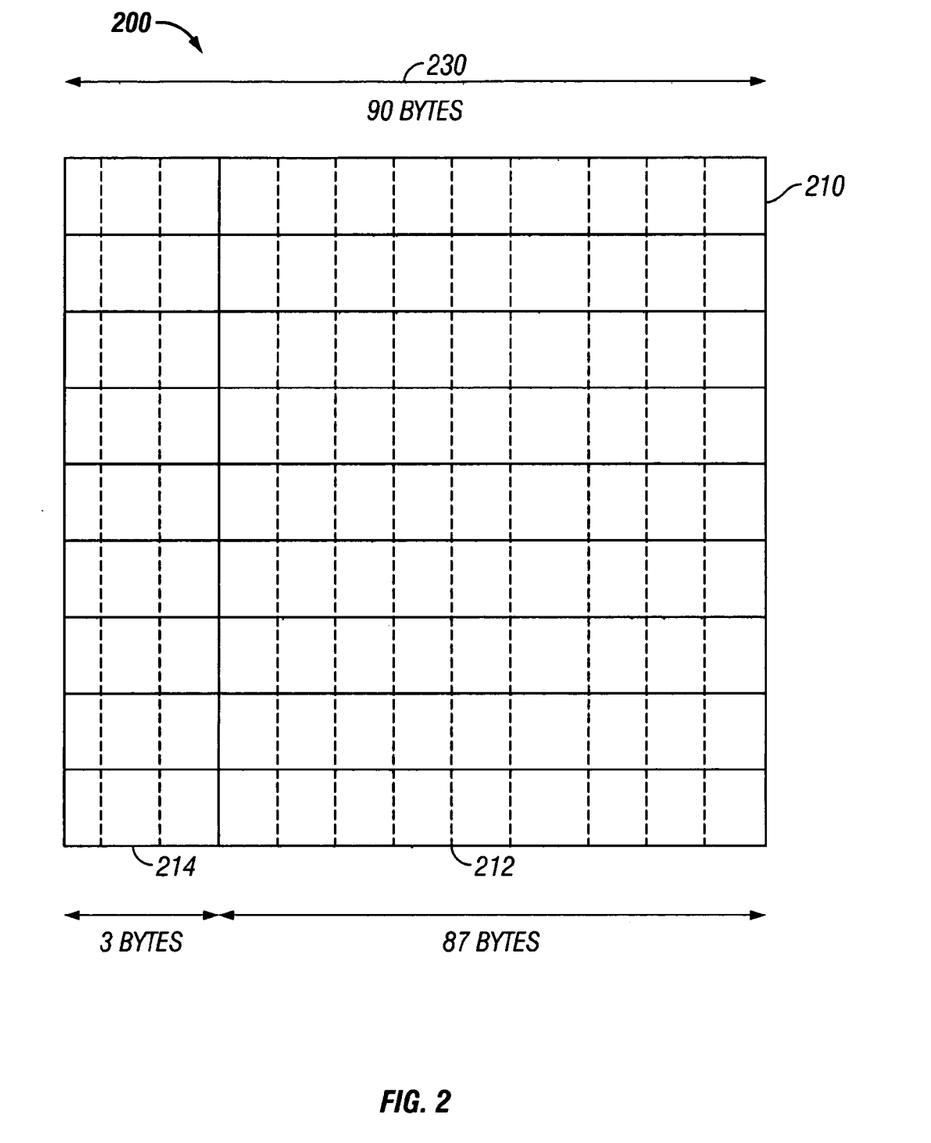
FIG. 2 is a block diagram of a SONET frame format for a STS-1("Synchronous Transport Signal-1") block.

FIG. 2 illustrates aspects of the STS-1 block format. The STS-1 block is used as a building block for transmission in a SONET system. Several STS-1 blocks may be combined to create a system that operates at a higher line rate. A higher speed system (e.g., multiplexer 130 in FIG. 1) may aggregate several STS-1 blocks to reduce fiber requirements across a wide area network.

The STS-1 block 200 is a logical arrangement of data that includes nine rows 210 that are each 90 bytes wide. Each row 210 includes an optional transport overhead 214 that is 3 bytes wide and a payload 212 that is 87 bytes wide (or 90 bytes wide when there is no transport overhead). In general overhead and parameters for the line and section layers are transmitted as part of the transport overhead 214. Path parameters (not shown), including the path parity error (e.g., bit interleaved parity error (BIP-8 (B3c)), are transmitted as part of the payload 212.

A SONET system transmits the first byte of the first row, then the second byte of the first row, and continues until the first row is transmitted. The SONET system then transmits the first byte of the second row, and continues in this manner until all bytes of all of the rows are transmitted.

Figure 3:
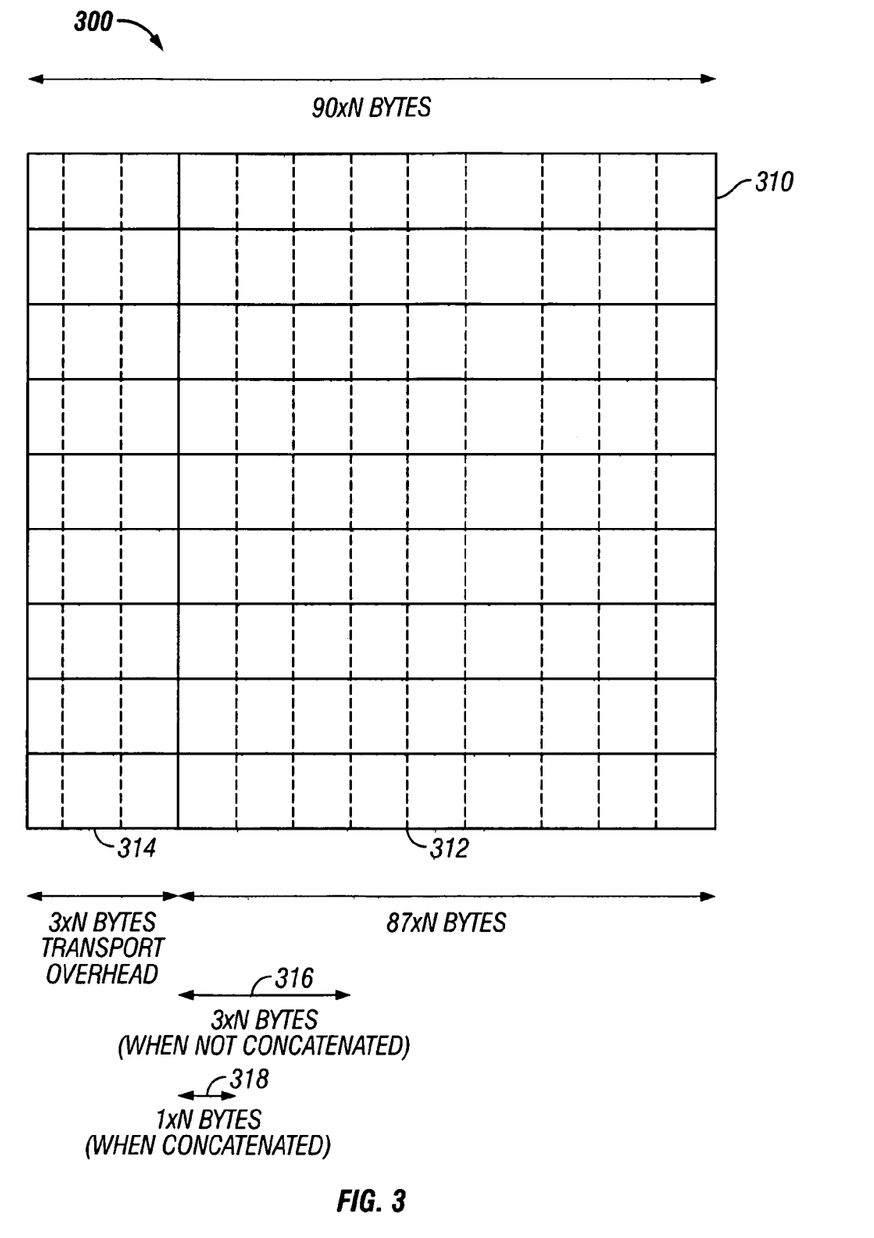
FIG. 3 is a block diagram of a SONET frame format for a STS-N ("Synchronous Transport Signal-N") frame.

FIG. 3 illustrates a STS-N frame 300 in which N is the number of STS-1 blocks per path. Like STS-1 block 200 in FIG. 2, STS-N frame 300 is 9 rows high. However, unlike STS-1 block 200, each STS-N row 310 is 90×N bytes wide. For example, in a STS-12 frame (i.e., N equals 12), each row is 1080 (90*12) bytes wide. Each STS-N row 310 has an optional transport overhead 314 and a STS-N payload 312. The transport overhead 314 is 3*N bytes wide and the payload is 87*N bytes wide when there is a transport overhead (or 90×N bytes wide when there is no transport overhead). For a number of reasons, commercial implementations often employ N=1, 3, 12, 48, 192, 768, and beyond. However, implementations may include devices that use a value of N that differs from the 4× multiples described above. For example, a device manufacturer may determine that due, for example, to fiber limitations and cost concerns, a STS-1536 architecture (approximately 80 Gigabits per second) should be implemented.

SONET systems may use an optional framing format called concatenation. Concatenation involves transmitting frames together, and eliminating the overhead that would normally be associated with each STS-1 within the larger STS-N system. Systems that use concatenated frame formatting are designated with a small "c" at the end of the system description. For example, a STS-3c frame concatenates 3 STS-1s, while a STS-3 frame does not concatenate the STS-1s.

Whether a frame is concatenated determines the format of the path overhead of the payload 312. For example, in a STS-3 frame, the first three columns of the payload 312 are path overhead (e.g., B3 parameters). This is shown by path overhead 316. In contrast, in a STS-3c frame, only the first column is path overhead, as is shown by path overhead 318. The second and third STS-1s in the STS-3c frame are considered slaves to the first STS-1 "master block." The master block provides parameters that described the payload of both the master block and the slave block.

Figure 4:
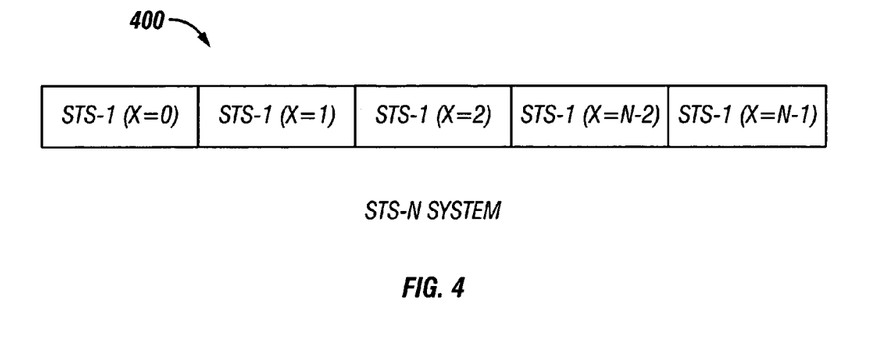
FIG. 4 is a block diagram illustrating interleaving of bytes in a STS-N system.

FIG. 4 shows how the bytes in the described STS-N frames are transmitted temporally. As shown, the system transmits the bytes sequentially, with the first byte corresponding to channel 0 being transmitted first. After the first byte of channel 0 (i.e., STS-N (X=0)) is transmitted, the first byte of the next channel (i.e., STS-N (X=1)) is transmitted. This continues until the first bytes for the next to last channel (i.e., STS-N (X=N-2)), and the last channel (i.e., STS-N (X=N-1)) are transmitted. After the first byte for the last channel (i.e., STS-N (X=N-1)) is transmitted, the next byte for channel 0 (i.e., STS-N (X=0)) is transmitted. Thus, in a queue of three frames to be transmitted, six bytes are transmitted before the third byte in the first frame (column 3) is transmitted (2*3 bytes).

Figure 5:
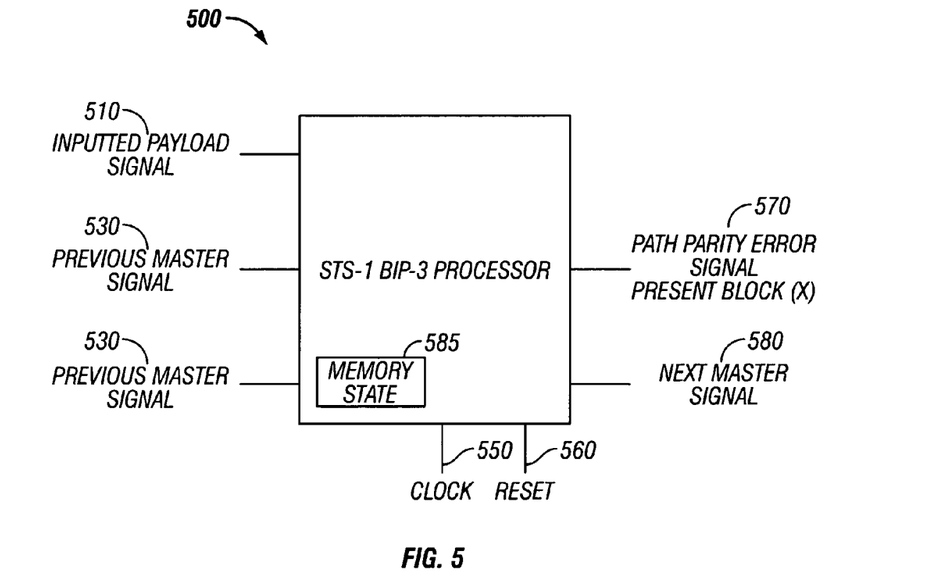
FIG. 5 is an input/output diagram of how a path parity signal for a STS-1 may be calculated in a SONET system.

FIG. 5 illustrates a block diagram of a circuit 500 that calculates a path parity error signal (i.e., BIP-8 (B3)) for a STS-1 block (i.e., STS-1 (X), where X is the STS-1 of interest). The circuit 500 includes three inputs (inputted payload signal 510, previous path parity signal 520, and previous master signal 530); two control signals (clock 550 and reset 560); and two output signals (path parity error signal for block (X) 570 and output master signal 580). Generally, a path parity error signal monitors for a parity error in a path (e.g., envelope 118 in FIG. 1). Although not shown in FIG. 5, a circuit calculating the path parity error also may include a bip_enable signal indicating that the path parity check should be calculated and a start-of-payload signal to indicate when the payload byte starts.

The inputted payload signal 510 describes an 8-bit signal that represents a byte in the payload of a received STS-N frame. The previous path parity signal 520 describes the path parity value from the BIP-8 (B3) processor that calculated the path parity for the previous STS-1 (i.e., STS (X−1)). The previous master signal 530 indicates whether STS-1 (X−1) is a master STS-1 that includes a STS-1 with the overhead that describes the rest of the STS-1s that follow. For example, in a STS-12 signal, two STS-6c's may be multiplexed In the first STS-6c, one of the STS-1s will be a master STS-1 with the path overhead (e.g., path overhead 316 in FIG. 3). The remaining five STS-1s will be slave STS-1s without the path overhead. The memory state 585 of the path parity error for the circuit 500 is internally maintained and includes the parity value updated as successive bytes in a payload are received. Although the output signals may be referenced as B3c, the frame is not required to be concatenated. Rather, B3c describes that the output is modified to account for concatenation.

The clock 550 may be used to provide the timing reference used in logical circuits to separate signals temporally. Implementations may include using other control signals in the path parity processor. For example, interblock communications may be included to indicate when one of the inputted signals (e.g., signal 510, 520, or 530) has arrived.

Path parity error signal 570 indicates the BIP-8 (B3c) path parity error value for STS-1(X). Path parity error signal 570 may include an 8-bit wide signal and be available at the end of each payload (deciding whether to use the memory state 585 or the previously path parity). The next master signal 580 indicates whether the present STS-1 (X) is a master STS-1 and is output to the path parity processor for the next STS-1.

Although the BIP-8 (B3) processor 500 is shown as a separate system, implementations may include integrating the logic of the circuit 500 into other systems, processors, software, or circuits. For example, the circuit 500 may be implemented as part of the digital logic in a SONET framing device. This logic may reside alongside and/or share components with circuits that perform other functions. For example, a processor that frames SONET data also may perform calculations for other parameters. These calculations may be performed in the course of operating a SONET framing circuit.

Although implementations may use the circuit 500 in an ASIC ("Application Specific Integrated Circuit") in order to take advantage of speeds that are generally available in silicon, the circuit 500 is not limited to ASIC implementations. Implementations may include various forms of programmable devices, including FPGAs (Floating Point Gate Array), software, and/or programmable functionality (e.g., EEPROMS (Electrically Erasable Programmable Read Only Memory)).

Various implementations of logic and signaling may be used to implement the circuit 500. For example, implementations may include leading edge and trailing edge logic. Other implementations may include return-to-zero and non-return-to-zero logic.

Various combinations of the logic may be used to calculate the path parity signal. Some implementations may feature AND gates, XOR gates, NOT gates, and/or OR gates to combine the different signals. For example, in a logic circuit that features an implementation of X=NOT (A AND B), other implementations that determine the same result may use X=(NOT A OR NOT B). Other implementations may combine the signals in a different order.

Figure 6:
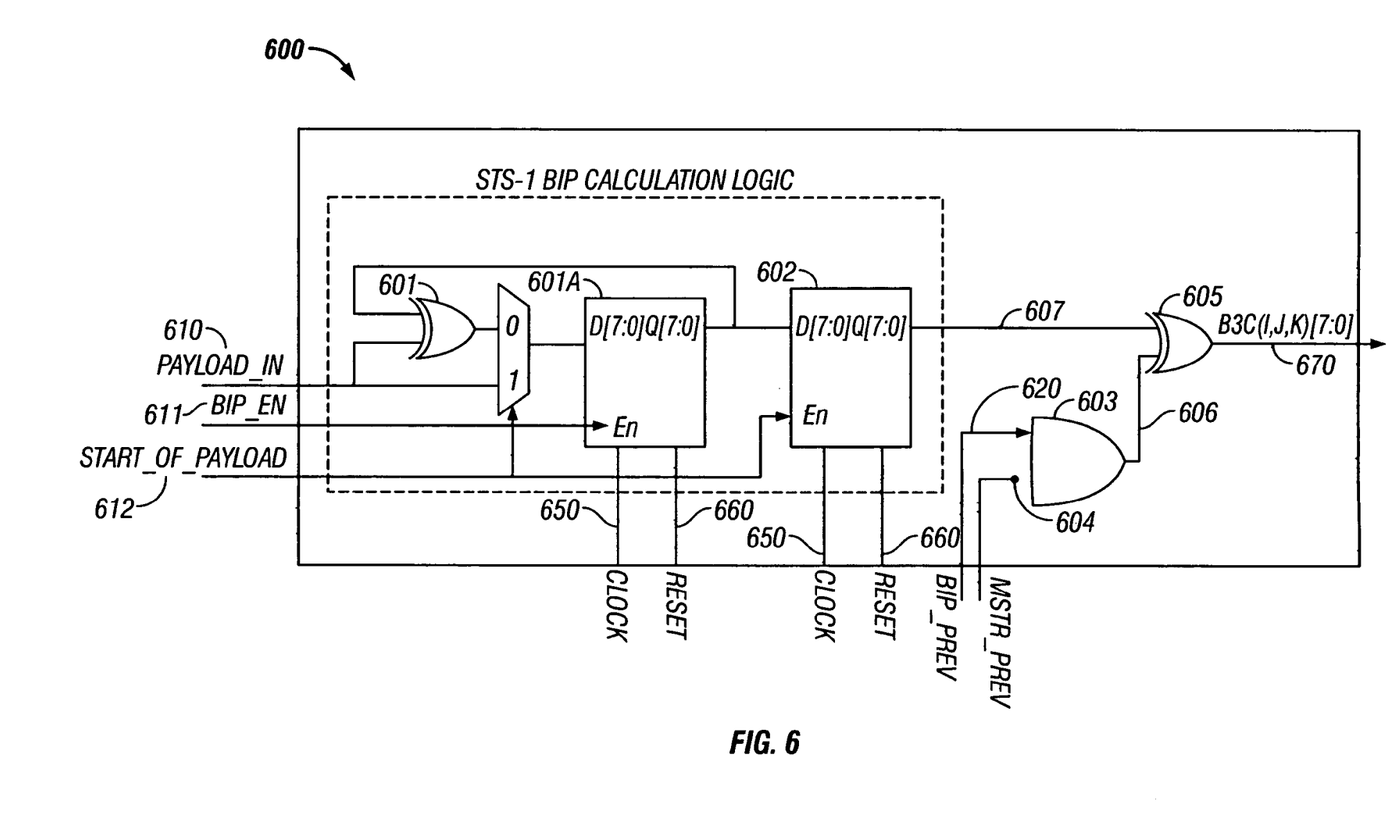
FIG. 6 is a block diagram of digital logic used in one implementation for calculating the path parity error (BIP-8 (B3c)) for a STS-1 in a SONET system.

FIG. 6 illustrates the digital logic used in one implementation of a path parity processor (e.g., circuit 500 in FIG. 5). The signals in the path parity processor 600 generally correspond to signals described with respect to the circuit processor 500. For example, inputted payload 610, previous path parity signal 620, and previous master signal 630 may correspond to inputted payload signal 510, previous path parity signal 520, and previous master signal 530 in FIG. 5. The bip_enable and start_payload signals described with respect to FIG. 5 may correspond to the bip_en signal 611 and the start_of_payload signal 612. Similarly, two other control signals, clock 650 and reset 660, may correspond to clock 550 and reset 560 in FIG. 5. Finally, the path parity error signal 670 may correspond to the output signal, path parity error signal 570 in FIG. 5.

When bip_enable signal 611 and clock 650 are asserted, the inputting payload signal 610 and the memory state signal (residing in circuit 601) are combined in XOR gate 601 resulting in the next state of the memory element 601. The contents of the memory element 602 are loaded from memory element 601 with each new payload (e.g., upon assertion of start_of_payload 612) and the latched value is fed forward to memory element 602 as the present path parity signal. Thus, the memory state maintains a value of the bytes in a payload that have been XORed with subsequently arriving bytes in the payload. Memory element 602 transits signal 607, which is the path panty calculated over the entire payload made up of the bytes of the STS-1 block in question, irrespective of whether the STS-1 block is a master or slave.

The previous path parity signal 620 and the previous master signal 630 are combined in AND circuit 603 to produce an output 606, after previous master signal 630 has been inverted through a NOT gate 604.

Outputs 606 and 607 are combined in XOR gate 605 to calculate the output—that is path parity signal 670. Although the next master signal (e.g., next master signal 580 in FIG. 5) is not shown in FIG. 6, the master signal may indicate whether the present STS-1 is a master STS-1 would be buffered and provided to the next path parity processor. This results in a final path parity value of this STS-1 being updated for the concatenation across the hierarchy of multiple STS-1s.

Figure 7:
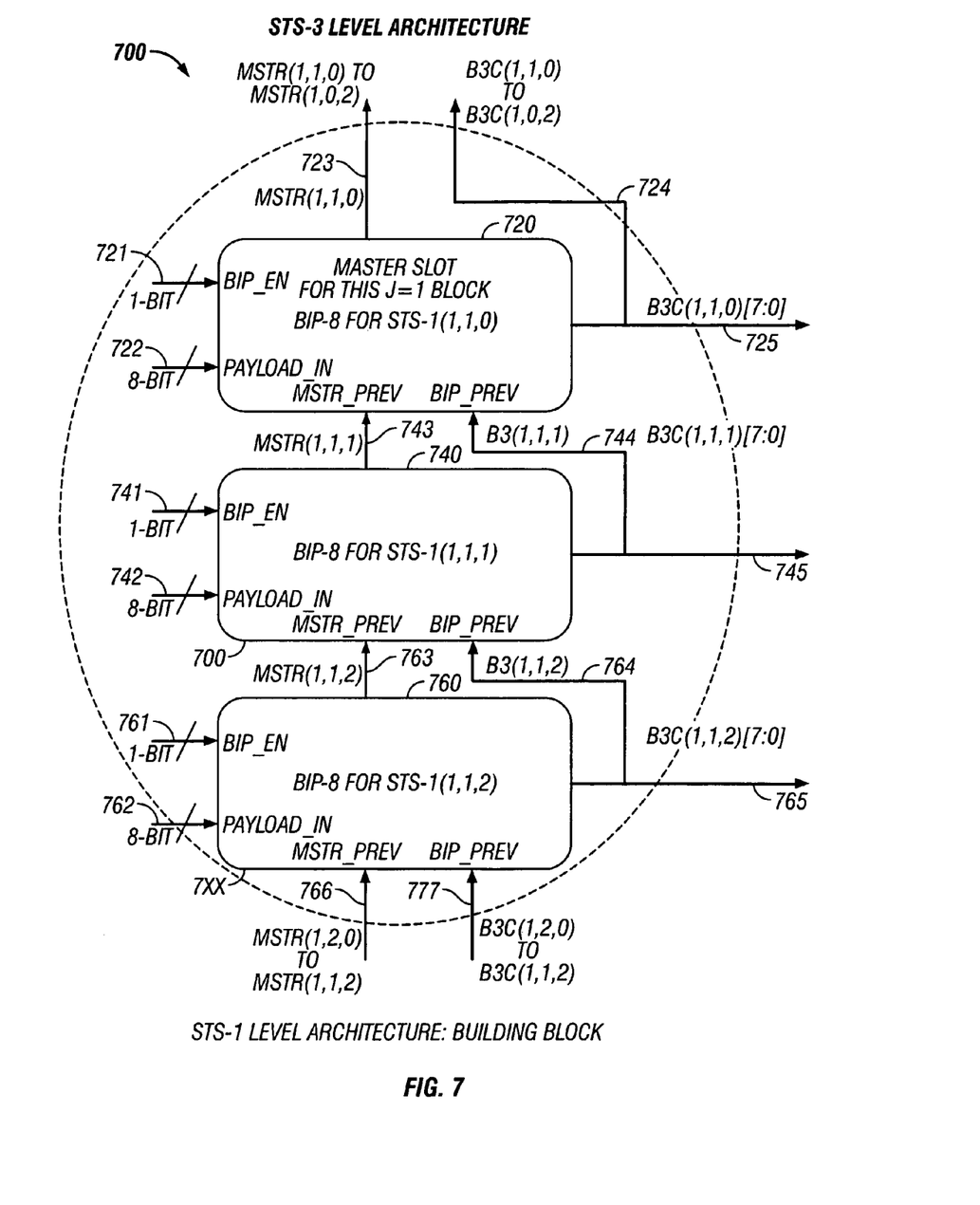
FIG. 7 is a block diagram for a STS-3 system that uses path parity error building blocks, such as the path parity error systems shown in FIGS. 5 and 6.

FIG. 7 shows a block diagram for a STS-3 architecture using STS-1 processors as building blocks. For example, the path parity processors described in FIGS. 5 and 6 may be used as the building blocks. In general, the STS-3 architecture 700 is structured and arranged to incorporate three STS-1 path parity processors. Each path parity processor (e.g., STS-1 path parity processors 720, 740, and 760) may use inputs from the neighboring path parity processor to calculate the path parity signal. The path parity processor for STS-1 (X) outputs the path parity signal to the logic calculating the path parity signal for STS-1 (X+1) and also to the output. The path parity processor also transmits the master signal for STS-1 (X) to the path parity processor calculating the path parity for STS-1 (X+1).

STS-3 architecture 700 uses three STS-1 path parity processors 720, 740 and 760. Each STS-1 path parity processor has inputted payload signals 722, 742 and 762, and encodes path parity signals 721, 741, and 761 that indicate when the STS-1 path parity processor may calculate the path parity for the present block (X). The STS-1 path parity processor for STS-1 (X) includes as inputs master signals 723, 743 and 766, and previous path parity signals for STS-1 (X−1) 744, 764, and 767. STS-1 path parity processor 720 outputs the path parity signal as an input to the neighboring STS-1 path parity processor (not shown). The neighboring STS-1 path parity processor resides on a device (e.g., circuit or logic) that calculates the path parity values for the STS-3 path parity processor. However, implementations may include the next block residing in a device of a different level. For example, the STS-3 architecture 700 may transmit the path parity signal 724 to a circuit that calculates the path parity values for a STS-1 block (a lower level circuit), a STS-3 block (same level circuit), or a STS-12 block (a higher level circuit).

In the case of STS-1 path parity processor 760, the previous master signal 766 and the previous path parity signal 767 are received from a neighboring STS-1 path parity processor (not shown). The neighboring STS-1 path parity processor may include a circuit that calculates the path parity values for a STS-1 block (a lower level circuit), a STS-3 block (same level circuit), or a STS-12 block (illustrating a higher-level circuit).

The parenthetical labels on the STS-1 circuit illustrate how the STS-1 processor relates to a larger SONET circuit. For the notation (X, Y, Z), X indicates the STS-12 processor that includes the present STS-3 path parity processor, Y indicates the present STS-3 path parity processor within the STS-12 processor, and Z indicates the present STS-1 path parity circuit in the STS-3 path parity circuit. For a STS-12 circuit, X and Y may span a range of four values from (0 . . . 3) or (1 . . . 4). Z may span a range of values from (0 . . . 2) or (1 . . . 3). Implementations may include a numbering system that goes in reverse order (e.g., from (3 . . . 1), (2 . . . 0), (3 . . . 0), or (4 . . . 1)). Neither numbering scheme changes the use of the outputs of a first path parity circuit as inputs to a second path parity circuit.

Figure 8:
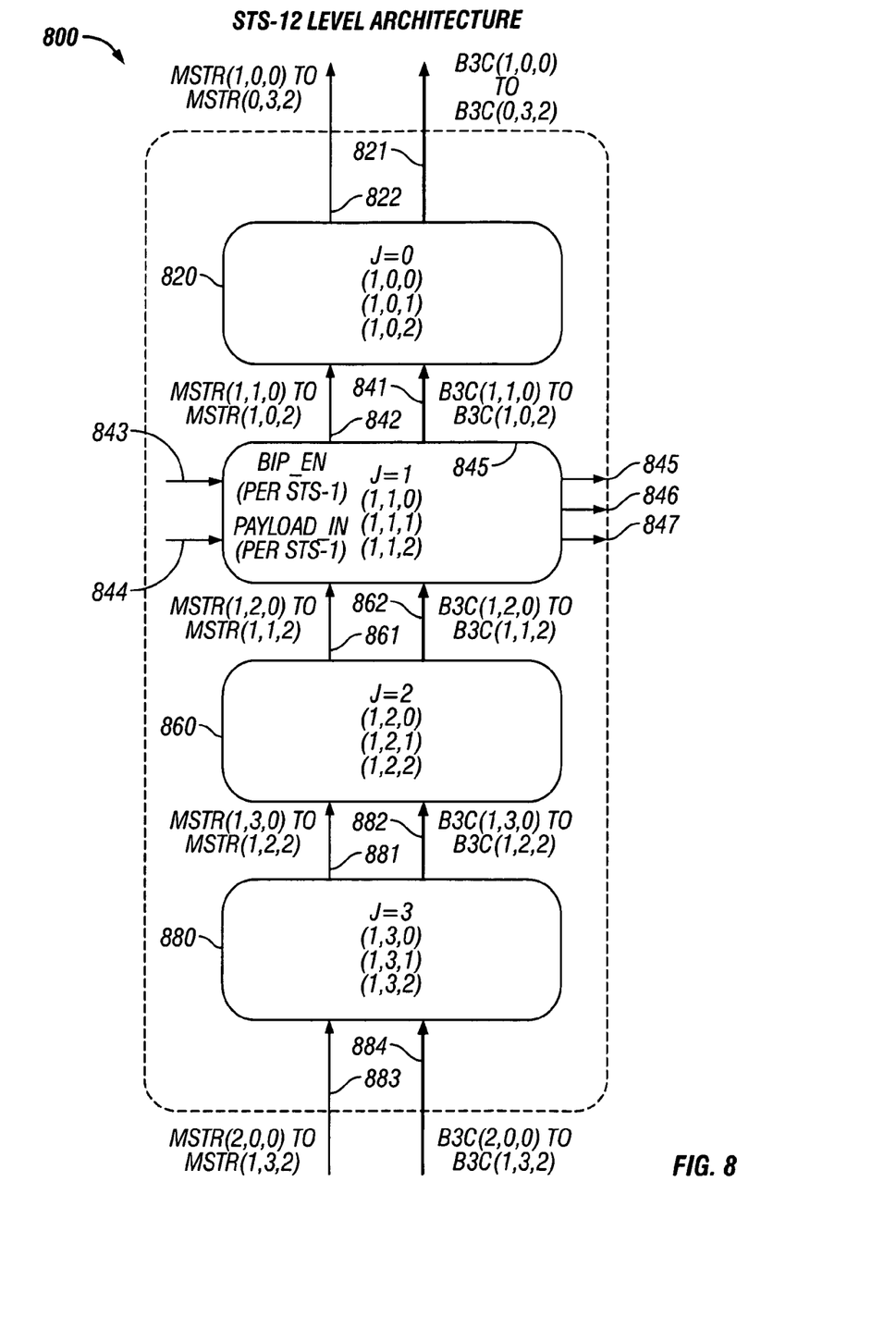
FIG. 8 is a block diagram of a STS-12 path parity architecture that shows how four STS-3 path parity processors, such as the STS-3 path parity processor shown in FIG. 7, may be used to create a STS-12 path parity processor.

Referring to FIG. 8, STS-12 path parity architecture 800 illustrates how four STS-3 path parity processors may be combined to create a STS-12 path parity processor. STS-12 path parity architecture 800 includes STS-3 path parity processors 820, 840, 860, and 880. Generally, aspects of the STS-3 processors correspond to aspects of the STS-3 processor described with respect to FIG. 7. However, FIG. 8 illustrates how the STS-3 circuits are combined in a higher-level implementation, in this case, a STS-12 path parity circuit. In particular, STS-12 path parity architecture 800 shows how the previous master signals 842, 861, 881 and 883 and previous path parity signals 841, 862, 882, and 884 are used as inputs to the STS-3 path parity processors 820, 840, 860, and 880.

The master signal and output of the highest STS-1 path parity processor in the path parity processor 820 (also known as (1, 0, 0)) is used as an input to the neighboring STS-3 BIP-8 (B3c) processor (also known as (0, 3, 2)). Similarly, the outputs of STS-3 path parity processor (2, 0, 0) (not shown) are used as inputs 883 and 884 to STS-3 path parity processor 880 (specifically to STS-1 path parity processor (1,3,2)).

Figure 9:
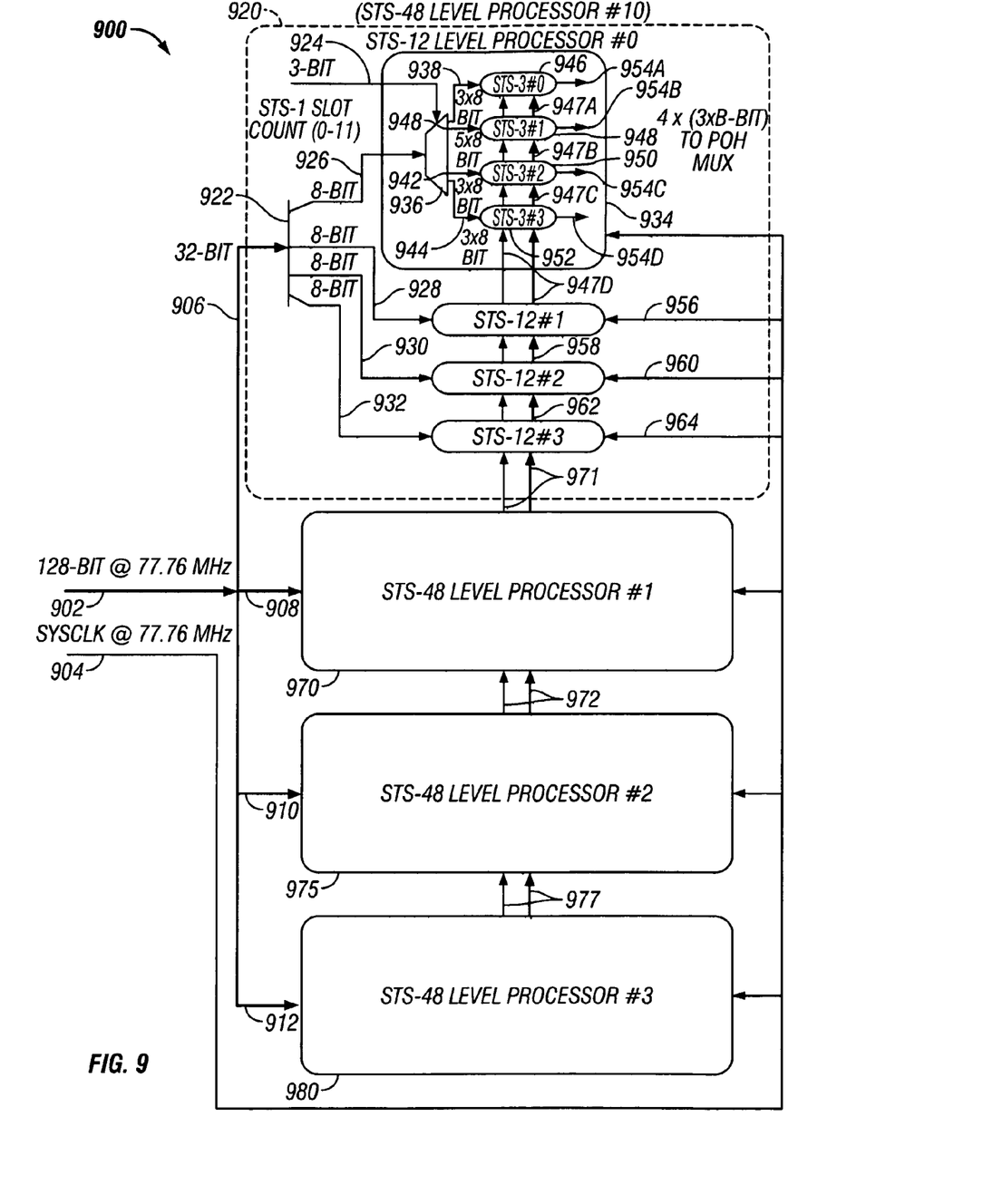
FIG. 9 is a block diagram of an STS-192 path parity architecture that shows how four STS-48 path parity processors may be used to create a STS-192 path parity processor.

FIG. 9 shows an exemplary STS-192 path parity architecture 900. Generally, the STS-192 path parity architecture 900 includes four STS-48 path parity processors. In general, STS-192 path parity architecture 900 takes an incoming 128-bit signal 902, and sends the 128-bit signal 902 out as four 32-bit signals 906, 908, 910, and 912 to STS-48 processors 920, 970, 975, and 980.

Each STS-48 path parity processor sends the output signals 977, 972, and 971 as inputs to the neighboring STS-48 path parity processor. The output signals 977, 972 and 971 may be the previous master signals and previous path parity signals described with respect to FIGS. 5–8.

An exemplary circuit is expanded to illustrate the operation of STS-48 path parity processor 920. STS-48 path parity processor 920 is structured and arranged to include a signal splitter 922, inputted payload signals 926, 928, 930, and 932, and STS-12 path parity processors 934, 956, 960 and 964. In general, aspects of the STS-12 path parity processor 934 correspond to aspects of the STS-12 path parity architecture 800 described with respect to FIG. 8. However, the STS-12 path parity processor 934 illustrates how a wide signal (e.g., 32-bit signal 906) may be broken out into an 8-bit wide signal (e.g., signal 926) by signal splitter 922. After 32-bit signal 906 is separated into 8-bit signals by signal splitter 922, the 8-bit signals are inputted into the STS-12 path parity processors 934, 956, 960 and 964.

An exemplary STS-12 path parity processor 934 is further broken out to illustrate how the STS-12 path parity processor may be arranged to calculate the path parity for a STS-3 processor. STS-12 path parity processor 934 includes a 3-bit control signal 924, a signal controller 936, and STS-3 path parity processors 946, 948, 950, and 952. In general, the 3-bit control signal 924 instructs the signal controller 936 which STS-1 in the larger signal is being received. Generally, the STS-3 path parity processor corresponds to the STS-3 path parity processors described with respect to FIGS. 7 and 8. STS-3 path parity processors 946, 948, 950, and 952 receive 8-bit inputs 938, 940, 942, and 944, and previous path parity signals and previous master signals 947A, 947B, 947C, and 947D to generate output signals 954A, 954B, 954C and 954D (that are multiplexed).

Although STS-192 path parity processor illustrates signals of a specified width (e.g., 128-bit input 902) and other signals that are multiplexed (e.g., output signals 954A, 954B, 954C, and 954D), implementations may include adjusting these signals by multiplexing and/or widening the signal. For example, the 32-bit input 906 may be implemented as a 16-bit multiplexed signal. Similarly, the output signal 954A includes a signal multiplexed three times. However, implementations may include providing the output signal 954A as a 24-bit wide signal.

Figure 10:
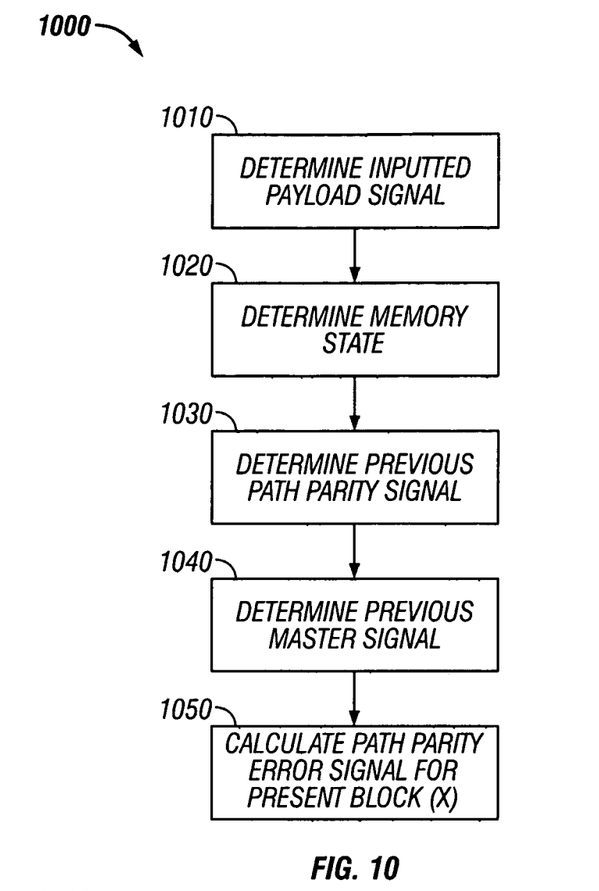
FIG. 10 is a flow chart that shows how the path parity error may be calculated in a SONET system.

Referring to FIG. 10, a flow chart 1000 illustrates a process enabling the path parity for a STS-1 to be calculated. In general, the path parity for a STS-1 may be calculated by determining an inputted payload signal (1010), determining the memory state signal (1020), determining the previous path parity signal (1030), determining the previous master signal (1040), and calculating the path parity for the present STS-1 (X) (1050).

The signals in FIG. 10 are generally described with respect to FIGS. 5–9. For example, the inputted payload signal described may correspond to the inputted payload signals 510, 610, 722, 844, and 926. The memory state signal referred may correspond to the memory state maintained internally (e.g., memory state 585), described with respect to FIGS. 5 and 6.

The previous path parity signal may refer to previous path parity signals 520, 620, 744, 841, and 947A (in part) referred to with respect to FIGS. 5–9. The previous master signal may refer to previous master signals 530, 630, 743, 842, and 917A (in part) discussed with respect to FIGS. 5–9. Similarly, the path parity may refer to the path parity 570, 670, 725, 815, and 954A of FIGS. 5–9 (modified for concatenation).

Generally, determining the inputted payload signal (1010) includes determining the value of an 8-bit payload that is submitted. Determining a payload signal may include preparing a circuit to receive an input from a specified source. For example, determining the inputted payload signal may include connecting a buffer that receives a payload to the path parity processor (e.g., STS-1 path parity processor in FIG. 6). Implementations also may include a control sequence whereby the path parity processor generates a ready signal indicating that the inputted payload signal should be sent. For example, the STS-1 path parity processor may transmit a ready signal to an input buffer that transmits the inputted payload signal in response and also a path parity signal instruction to the path parity processor to encode the signal.

Generally, determining the memory state includes determining the present state of the path parity (1020). A memory device may be used that preserves the present value of the path parity, so that it may be combined with inputs as was described with respect to FIG. 5.

Determining the previous path parity signal comprises enabling the path parity processor calculating the path parity to receive path parity from the processor calculating the path parity for the previous block, STS-1 (X−1) (1030). Determining the previous master signal includes enabling the STS-1 path parity processor calculating the path parity for STS-1 (X) to receive a signal from the STS-1 path parity processor calculating the path parity for STS-1 (X−1) indicating whether STS-1 (X−1) is a master STS-1 (1040). The path parity for STS-1 (X−1) signal and the previous master signal may be received by an interconnect. Other examples of determining the signals from the previous block may include receiving the signal that was calculated in a first processor that is different from the second processor that is calculating the path parity. The first processor may comprise a separate chip. Other implementations may include using the ready signal described above.

The STS-1 path parity processor calculates the path parity (1050). In general path parity for present STS-1 (X) may be calculated by relating the inputted payload signal, the present path parity state signal for STS-1 (X), the previous path parity for STS-1 (X−1), and the previous master signal. For example, the signals may be combined by setting the path parity for the present STS-1 (X) to the logical value of:

(inputted payload signal XOR present path parity) XOR (previous path parity AND NOT previous master signal).

Figure 11:
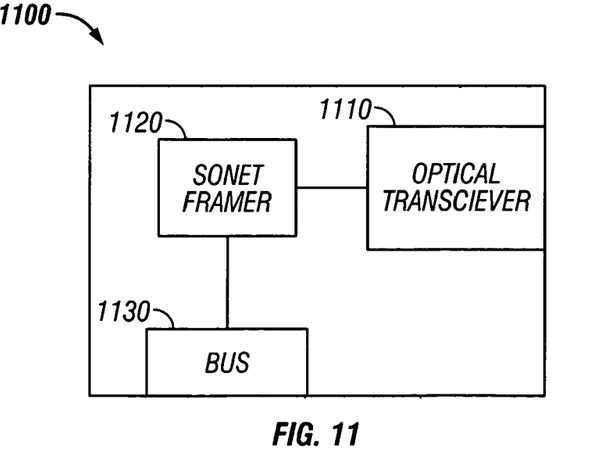
FIG. 11 illustrates how on optical interface card may use a processor configured to calculate a path parity error.

FIG. 11 illustrates how an optical interface card 1100 may use a circuit configured to calculate a path parity error. Generally, an optical interface card 1100 is configured to receive an optical signal, extract data from the optical signal, and make the data available on a bus or interconnection for use by a networking system or a computing system. Extracting data from the optical signal may include calculating parity errors, including path parity errors, to verify that the data was not received in error.

The optical interface card 1100 may form part of, but is not limited to, a network interface card, an add-drop multiplexer (ADM), Dense Wavelength Division Multiplexing (DWDM) equipment, or a line card on a switch, router, or hub. The optical interface card includes an optical transceiver 1110, a SONET framer 1120, and a bus 1130. The optical transceiver 1110 converts data between electrical and optical formats. Once in an electrical format, the optical transceiver 1110 may exchange data with a SONET framer 1120. The SONET framer 1120 may verify the content of data received, for example, trough performing a path parity check. The SONET framer 1120 also may verify that the data is correctly framed. The SONET framer 1120 also may receive data from a bus 1130 for transmission to the optical transceiver 1110.

The bus 1130 includes interconnects configured to interface the optical interface card 1100 with an automated system (e.g., a computer or a piece of networking equipment). Specifically, the bus 1130 is configured to exchange data with the SONET framing circuit 1120 and the automated system. The bus 1130 may exchange data through an interconnect, such as, for example, a serial or parallel data path. The bus 1130 may include switched interconnects configured to enable direct communications between different components in the automated system. In another example, the bus 1130 may incorporate shared interconnects, that is, where the different components contend for the same resources.

Other implementations are within the scope of the following claims. In particular, in some implementations, programmable logic may be used that interconnects the STS-1 processors based on the higher order concatenation.

What is claimed is:

1. A method of calculating a path parity error signal value, the method comprising:
   determining an inputted payload signal representing a payload value found in a first block;
   determining a memory state representing a current path parity value for the processor calculating the path parity error signal;
   determining a previous path parity signal representing a path parity error value for a previous block;
   determining a previous master signal indicating whether the previous block is a master block; and
   calculating a path parity error signal by relating the inputted payload signal, the memory state, the previous path parity signal, and the previous master signal.

2. The method of claim 1 wherein the first block comprises a STS-1 (X) (where STS-1 indicates a Synchronous Transport Signal-1 and X indicates the STS-1 of interest) in a STS-Mc frame ("Synchronous Transport Signal-M concatenated", where Mc indicates the size of any valid concatenated block), that is part of a STS-N system (where N indicates the line signaling rate), and the previous block represents STS-1 (X−1).

3. The method of claim 1 wherein calculating the path parity error signal includes logically setting the path parity error signal to (the inputted payload signal XOR the memory state) XOR (the previous path parity signal AND NOT the previous master signal).

4. The method of claim 1 wherein the previous path parity signal is the path parity error signal for the previous block that was calculated in a second processor that is different from a first processor that calculates the path parity signal for the first block.

5. The method of claim 4 wherein the second processor comprises a separate chip.

6. The method of claim 4 wherein the second processor calculates the path parity error signal for a system of a different level than the first processor.

7. The method of claim 1 wherein the previous path parity signal is the path parity error signal for the previous block that was calculated in a neighboring path parity processor that is different from the path parity processor calculating the path parity signal for the first block.

8. The method of claim 1 wherein the previous master signal is the master signal of the previous block received from a second processor that is different from a first processor that calculates the path parity error signal for the first block.

9. The method of claim 8 wherein the second processor comprises a separate chip.

10. The method of claim 8 wherein the second processor calculates the path parity error signal for a STS-1 of a different level than the first processor.

11. The method of claim 1 wherein the previous master signal is the master signal of the previous block received from a STS-1 path parity processor that is different from the STS-1 processor calculating the path parity error signal for the first block.

12. A circuit configured to calculate a path parity error signal value, the circuit comprising:
    a first interconnect structured and arranged to determine an inputted payload signal representing a payload value found in a first block;
    a first buffer structured and arranged to determine a memory state representing a current path parity value for the processor calculating the path parity error signal;
    a second interconnect structured and arranged to determine a previous path parity signal representing a path parity error value for a previous block;
    a third interconnect structured and arranged to determine a previous master signal indicating whether the previous block is a master block; and
    a calculating processor structured and arranged to calculate a path parity error signal by relating the inputted payload signal, the memory state, the previous path parity signal, and the previous master signal.

13. The circuit of claim 12 wherein the first block comprises a STS-1 (X) (where STS-1 indicates a Synchronous Transport Signal-1 and X indicates the STS-1 of interest) in a STS-Mc frame ("Synchronous Transport Signal-M concatenated", where Mc indicates the size of any valid concatenated block), that is part of a STS-N system (where N indicates the line signaling rate), and the previous block represents STS-1 (X−1).

14. The circuit of claim 12 wherein the calculating processor includes logic structured and arranged to calculate the path parity error signal by logically setting the path parity error signal to (the inputted payload signal XOR the memory state) XOR (the previous path parity signal AND NOT the previous master signal).

15. The circuit of claim 12 wherein the previous path parity signal is the path parity error signal for the previous block that was calculated in a second processor that is different from a first processor that calculates the path parity signal for the first block.

16. The circuit of claim 15 wherein the second processor comprises a separate chip.

17. The circuit of claim 15 wherein the second processor calculates the path parity error signal for a system of a different level than the first processor.

18. The circuit of claim 12 wherein the previous path parity signal is the path parity error signal for the previous block that was calculated in a neighboring path parity processor that is different from the path parity processor calculating the path parity signal for the first block.

19. The circuit of claim 12 wherein the previous master signal is the master signal of the previous block received from a second processor that is different from a first processor that calculates the path parity error signal for the first block.

20. The circuit of claim 19 wherein the second processor comprises a separate chip.

21. The circuit of claim 19 wherein the second processor calculates the path parity error signal for a STS-1 of a different level than the first processor.

22. The circuit of claim 12 wherein the previous master signal is the master signal of the previous block received from a STS-1 path parity processor that is different from the STS-1 processor calculating the path parity error signal for the first block.

23. An optical interface card configured to operate within a SONET system, the optical interface card comprising:
   an optical transceiver structured and arranged to exchange data between optical and electrical formats;
   a SONET framing circuit structured and arranged to exchange data with the optical transceiver, the SONET framing circuit configured to perform a path parity check by
      determining an inputted payload signal representing a payload value found in a first block;
      determining a memory state representing a current path parity value for the processor calculating the path parity error signal;
      determining a previous path parity signal representing a path parity error value for a previous block;
      determining a previous master signal indicating whether the previous block is a master block; and
      calculating a path parity error signal by relating the inputted payload signal, the memory state, the previous path parity signal, and the previous master signal;
   a bus structured and arranged to interface the SONET framing circuit with an automated system that the bus is configured to support.

24. The optical interface card of claim 23 wherein the bus includes switched interconnects.

* * * * *